United States Patent
Steigerwald et al.

(10) Patent No.: US 9,723,709 B2
(45) Date of Patent: Aug. 1, 2017

(54) METHOD FOR ASSIGNING CONTROL CHANNELS

(76) Inventors: Todd Steigerwald, Austin, TX (US);
Tom Bentley, Austin, TX (US); Jerry Mayfield, Austin, TX (US); Brad Vier, Austin, TX (US)

(*) Notice: Subject to any disclaimer, the term of this patent is extended or adjusted under 35 U.S.C. 154(b) by 1693 days.

(21) Appl. No.: 12/256,467

(22) Filed: Oct. 22, 2008

(65) Prior Publication Data
US 2009/0163147 A1    Jun. 25, 2009

Related U.S. Application Data

(60) Provisional application No. 60/999,906, filed on Oct. 22, 2007.

(51) Int. Cl.
*H04B 1/44* (2006.01)
*H05K 1/02* (2006.01)
*H05K 1/03* (2006.01)
*H05K 1/18* (2006.01)

(52) U.S. Cl.
CPC .......... *H05K 1/0219* (2013.01); *H05K 1/0298* (2013.01); *H05K 1/0393* (2013.01); *H05K 1/189* (2013.01); *H05K 2201/09618* (2013.01); *H05K 2201/09709* (2013.01); *H05K 2201/09809* (2013.01); *H05K 2201/09981* (2013.01); *H05K 2201/10189* (2013.01)

(58) Field of Classification Search
CPC ....... H05K 1/0219; H05K 2201/09809; H05K 2201/09981; H05K 2201/10189
USPC .......................... 455/78, 550.1, 575.5, 73, 80
See application file for complete search history.

(56) References Cited

U.S. PATENT DOCUMENTS

| | | | | |
|---|---|---|---|---|
| 6,903,541 B2* | 6/2005 | Ziegner | ........... | H05K 1/0237 174/254 |
| 2004/0127249 A1* | 7/2004 | Hankui et al. | ........... | 455/550.1 |
| 2006/0276158 A1* | 12/2006 | Okabe | ........... | 455/333 |
| 2008/0088519 A1* | 4/2008 | Quan | ........... | H01Q 23/00 343/770 |
| 2008/0202807 A1* | 8/2008 | Wesselman | ........... | H05K 1/0221 174/388 |
| 2008/0230259 A1* | 9/2008 | Booth, Jr. | ........... | H05K 1/0224 174/254 |
| 2008/0254825 A1* | 10/2008 | Wilson | ........... | H04M 1/0202 455/556.1 |
| 2008/0316115 A1* | 12/2008 | Hill | ........... | H01Q 1/243 343/702 |
| 2008/0316116 A1* | 12/2008 | Hobson | ........... | H01Q 1/243 343/702 |
| 2009/0058735 A1* | 3/2009 | Hill | ........... | H01Q 1/243 343/702 |
| 2009/0163147 A1* | 6/2009 | Steigerwald | ........... | H05K 1/0219 455/73 |
| 2010/0007564 A1* | 1/2010 | Hill | ........... | H01Q 1/243 343/702 |

* cited by examiner

*Primary Examiner* — MD Talukder

(57) ABSTRACT

The present invention is a mobile device capable of transmitting or receiving wireless signals and incorporating an FPC shielded RF signal conductor for connecting transmitter and/or receiver circuitry to an associated RF antenna or antennas. In some embodiments FCP may incorporate the antenna in an unshielded section of the FPC. In some embodiments a single FPC may provide for multiple RF carrier conductors each with their own associated shielding.

9 Claims, 19 Drawing Sheets

METHOD FOR ASSIGNING CONTROL CHANNELS

RELATED APPLICATION

This application is a Utility application claiming priority of provisional application Ser. No. 60/999,906 filed on Oct. 22, 2007.

TECHNICAL FIELD OF THE INVENTION

The present invention generally relates to electrical interconnection of electromagnetic wireless transmitters and receivers to the antennas which transmit and/or receive electromagnetic wireless signals. More particularly this invention particularly relates to and is particularly useful to such interconnections in mobile devices such as mobile computers, radios, mobile phones, personal assistant devices (PDAs) or any other device which either transmits or receives wireless electromagnetic signals of one or multiple radio frequency (RF) or technologies with one or multiple wireless antennas.

BACKGROUND OF THE INVENTION

The current method of RF wiring in today's' personal computers, cell phones, and tablet PCs—although continually improved by companies around the world, still remains with many problems in design, difficulty of manufacture, non-ideal performance in many RF design areas. The entire WiFi and WWAN world has gradually, incrementally, improved many of these areas, including RF connector and coaxial wire design, but several problem areas still remain. Additionally, the 'mini' and 'micro' coaxial wiring / RF radio industry seems to be stalled in a paradigm of what wire is currently used, and how the antennas are supplied—commonly with wire 'tails'. Moreover, when one enters the world of Tablet PCs, the design and manufacturing problems, errors get even more numerous. The following are examples of limitations of using micro-wire (UFL/MHF) connections. UFL connectors are also known as U.FL and/or uFL and/or Ufl and/or u.fl and/or ufl connectors.

FIG. 1 illustrates a prior art mobile device 10 showing a typical arrangement of micro-wire coaxial cables 12 and 14 routing connections to multiple wireless radios 16 and antennas 22 and 24. The routing is not optimal and require being handled multiple times as parts are added. Some of these connections such as WWAN Main and WWAN Auxiliary connections must be routed outside the devices EMI shield 18 because the shielding of even the better quality prior art 1.32/1.37 mm Micro-wire coaxial cable is inadequate to protect the devices circuitry from the WWAN signals coursing trough the micro-wire. The routing of these micro-wires 12 and 14 are typically not uniform from device to device. Typically they are somewhat randomly taped in place. Even the connectors may not be attached in a uniform manner. Typically the micro-wire have male parts of a male female pairs of UFL (or alternatively IPEX, IPAX, MHF or AMC connectors) examples of which are available from Hirose of Japan. The connectors are characteristically round and do not register in a particular rotational position. The Receiver and/or transmitter circuit board and antennas typically has the female part of the UFL mail female connector pair which provides the connection port to which the micro wire is connected.

FIG. 2 is an illustration of another view of the device in FIG. 1 showing the routing of other micro-wire coaxial cables 32, 34, 36 to their respective antennas 42, 44, 46. While this is routing is more consistent and optimal than the WWAN routing illustrated in FIG. 1, the routing nevertheless posses manufacturing and repair problems due to kinking, pinching during manufacture use and/or repair of the device 10 these risk also cause problems with the micro-wires 12, 14 illustrated in FIG. 1.

FIG. 3 illustrates an exemplar mobile computing device. Including circuit boards that contain circuitry 16 designed to either generate RF signals for transmission or process received RF signals. It also contains antennas 22 and 24 that are specifically designed to send and or receive particular frequencies or frequency bands or combinations of frequencies or frequency bands. Examples include any wide area networks either local "WLAN" or wireless "WWLAN" blue tooth, GPS etc—basically any kind of electromagnetic transmission capable of being transmitted or received by an antenna.

FIG. 4 illustrates an example of a typical micro-wire 52. A typical micro wire has three major sections. The conductive wire itself 54 and two connects which were described above.

FIG. 5 illustrates a cross section of the conductive wire of the micro-wire. These wires are coaxial having a center core made of electrically conductor 58 typically a copper wire, surrounded by a nonconductive dielectric 60 which by definition is non-electrically conductive. The inner dielectric is surrounded by a braded shield 62 made of a conductive material for example copper or stainless steel. The shield is typically covered with another dielectric insulation layer 64.

These Micro-Wires are typically made with polymer dielectrics which result in a soft core so the wires are soft, squishy and deformable. These materials make the micro-wires easier to rout however it also makes them more likely to get pinched, kinked and deformed. When the wire is pinched VSWR performance is compromised causing signal reflection, waste and detuning of the cable). Thus more care is required in the manufacture and repair of products using the wire and thus in the design in the product resulting in design limitations caused by using the micro-wire.

Low EMI Noise is very important in many products. Thus WWAN TIS (Total Isotropic Sensitivity) is very important to these products. New EMI regulatory specifications have made it more difficult to comply with wireless noise specifications EMI Noise couples into coaxial wires to varying degrees requiring thinner micro-wire.

Micro-Wire's E-field shielding only provides about eight to eighty-five percent (80-85%) shielding effectiveness ($SE_E$=15 dB). For WWAN cell phone TIS EMI testing, this poor performance frequently requires additional external shielding to further shielding U/FL wire.

Woven Braided Shield typically found in micro-wire frequently is susceptible to H-fields with only about fifty percent (50%) shielding effectiveness ($SE_H$=6 dB). For WWAN cell phone TIS EMI testing, this poor performance also frequently requires additional external shielding to boost shielding effectiveness of U/FL wire.

Though it is called micro-wire at 1.37 mm (54 mils typ.) O.D thickness, micro-wire is a relatively thick part particularly to design into a hyper-thin product and particularly when avoidance of pinching during manufacture and repair needs to be taken into account when planning the routing of the micro-wires.

Because many wireless devices today require multiple antennas, multiple wires with are required frequently resulting in haphazard and varied placement of both antennas and wires which each must be individually routed and clipped in place taking many time consuming assembly steps. The wires certainly do not self align. The more steps the greater the chance of error during assembly or repair.

In order to keep the wires in place to avoid damage, cable guides are sometimes employed. Typically cable guides are plastic embosses or clips, which, by definition slightly crush the wire to hold it to the desired routing location. Mounting mechanisms being much too close to the signal inside the wire is both unavoidable and undesirable to performance.

Another design limitation related to the Micro wire relates to its minimum bend radius. Dropping below this radius will cause the cable to kink resulting in the aforementioned performance degradation of the cable. The minimum bend radius for a typical 1.38 mm O.D. Micro Coaxial Cable is 14 mm (which is over 500 mils). In order to comply with this limitation, it is frequently necessary to design a cabling route which is corkscrewing antenna in order to get from one level to another level in the a mobile device level to level. To violate this spec is to essentially, again, 'kink' the antenna wire leading to VSWR and performance losses.

Because of the problems associated with the micro-wire cable routing, currently it is atypical to provide a service loop in the RF wire making assembly and repair of the system more difficult. Typically when a service loop is provided it roams into EMI problematic areas requiring additional cable EMI and routing management. A service loop is potentially even more problematic if the service loop enters the actual antenna resonating area(s), affecting or detuning performance.

Current since RF systems are typically delivered with integrated wire tails. It is difficult to service, repair or upgrade these components and frequently requires disassembling of the entire device.

Furthermore, dedicated, non-swappable antennas typical in this industry require longer test periods to have multiple systems and tests support permutations of antennas and radio technology.

Consequently, the flaws and limitations of working with Micro-wire cable create a need for an improved devices and methods of connecting RF devices to other electronic components in a mobile computing device.

BRIEF DESCRIPTION OF THE DRAWINGS

For a more complete understanding of the present invention and the advantages thereof, reference is now made to the following description taken in conjunction with the accompanying drawings in which like reference numerals indicate like features and wherein.

DETAILED DESCRIPTION OF THE INVENTION

Preferred embodiments of the present invention are illustrated in the FIGUREs, like numerals being used to refer to like and corresponding parts of the various drawings.

The present invention generally relates to connecting wireless transmitter and/or receiver components electronic devices. For this purpose the invention employs the use of flexible circuit boards—particularly flexible printed circuits (FPC) technology. Devices with prior art micro-wire connections were discussed above in regards to FIG. 1, FIG. 2, FIG. 3, FIG. 4 and FIG. 5. Typical micro-wires have a diameter of approximately 1.37 mm (54 mil). Using FPCs the applicants have made connectors which are less than 0.50 mm (20 mils) in thickness which are drastically less susceptible to kinking, crushing, crimping or other hazards mentioned above.

Figure 1:
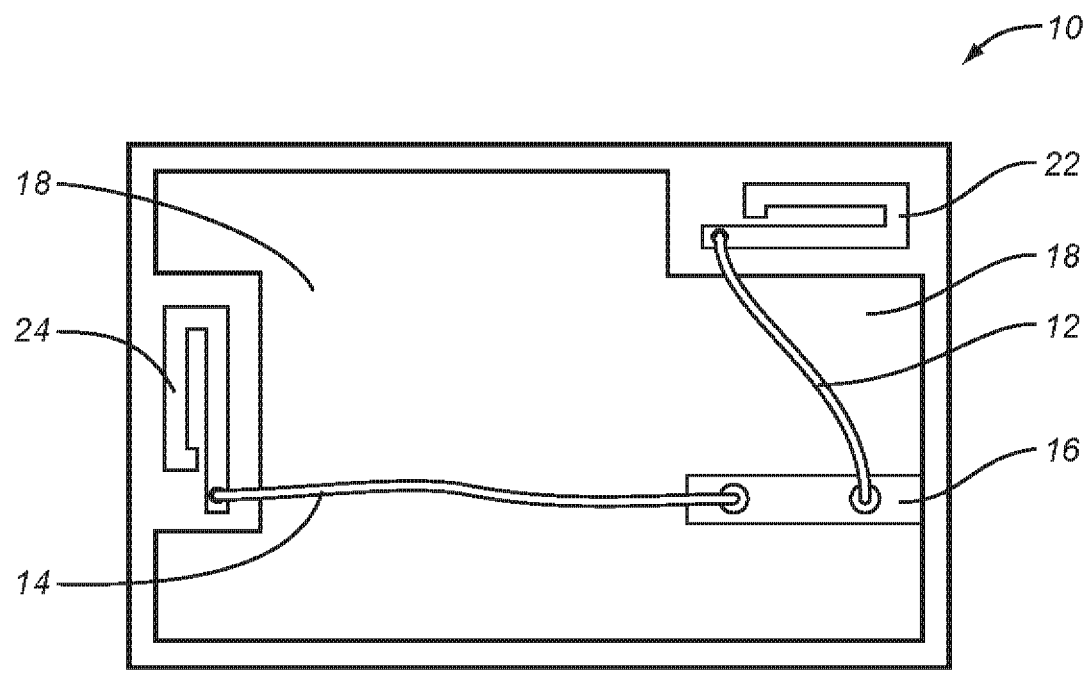
FIG. 1 illustrates RF micro-wire connections in a mobile computing device.
Figure 2:
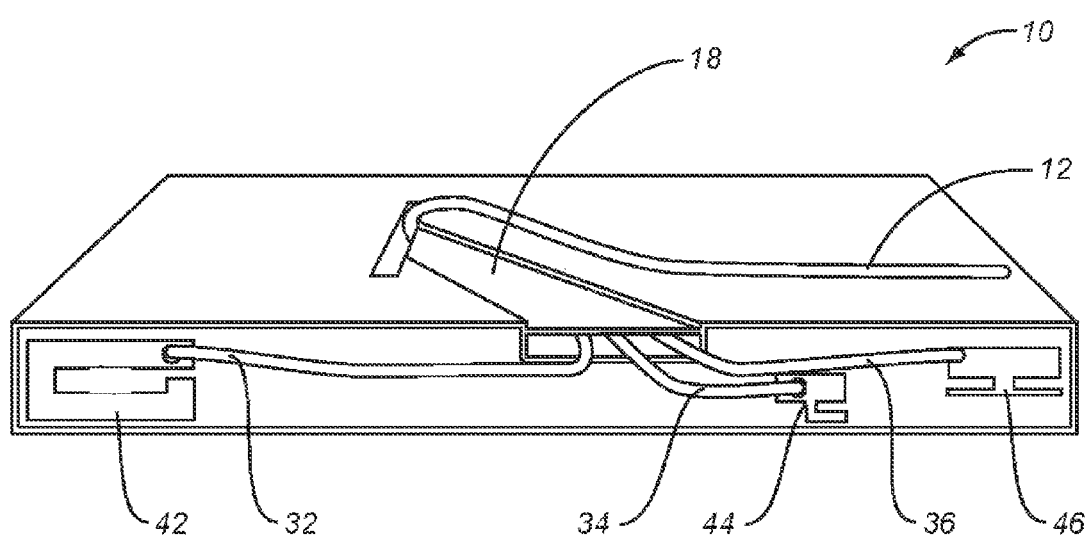
FIG. 2 illustrates another view of additional micro-wire connections in the mobile computing device of FIG. 1.
Figure 3:
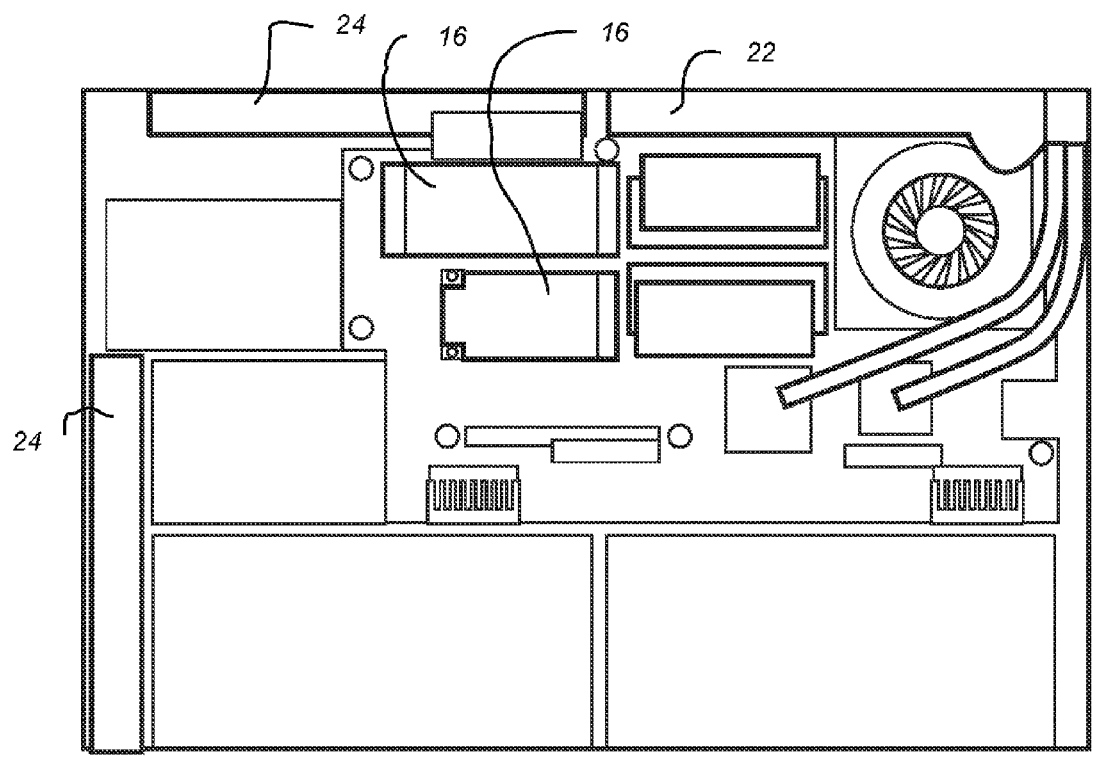
FIG. 3 illustrates another example of the connections needed in a an exemplar mobile computing device.
Figure 4:
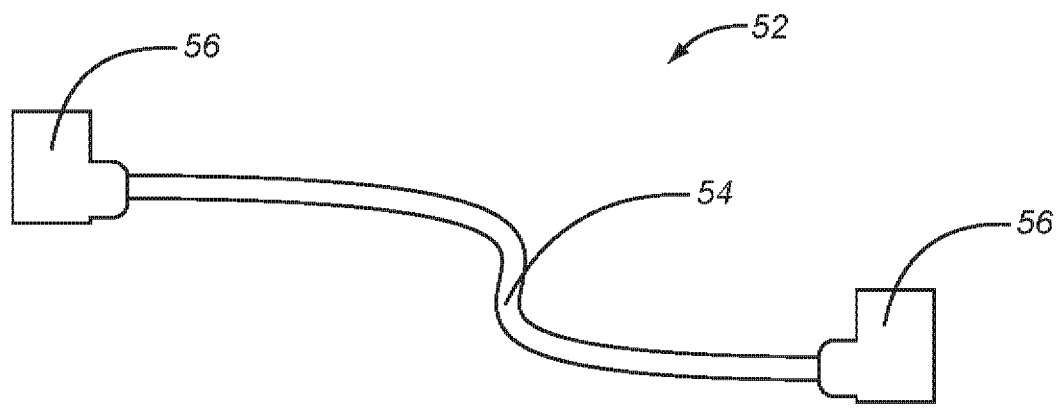
FIG. 4 illustrates a typical micro-wire.
Figure 5:
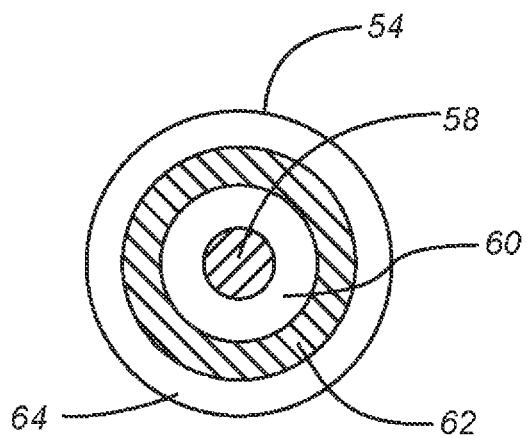
FIG. 5 illustrates a cross-section of a typical micro-wire.
Figure 6:
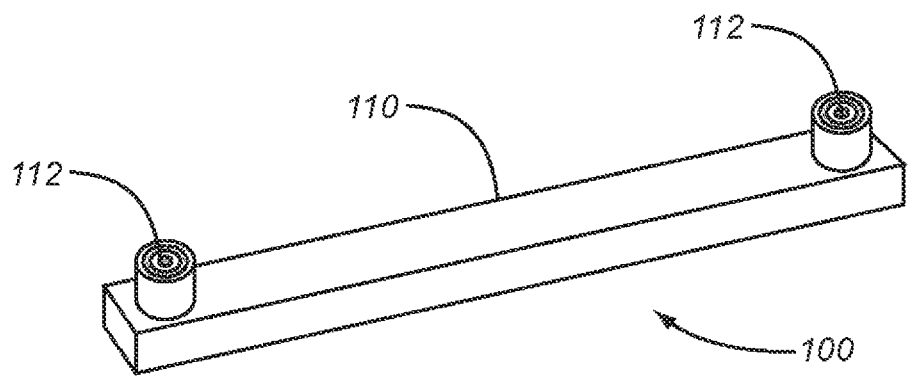
FIG. 6 illustrates an improved RF electrical flexible circuit connector.

FIG. 6 illustrates a simple embodiment of an FPC RF electrical connector 100 according to the present invention. It is comprised of the FPC section 110 and two surface mounted RF coaxial connectors 112.

Figure 7:
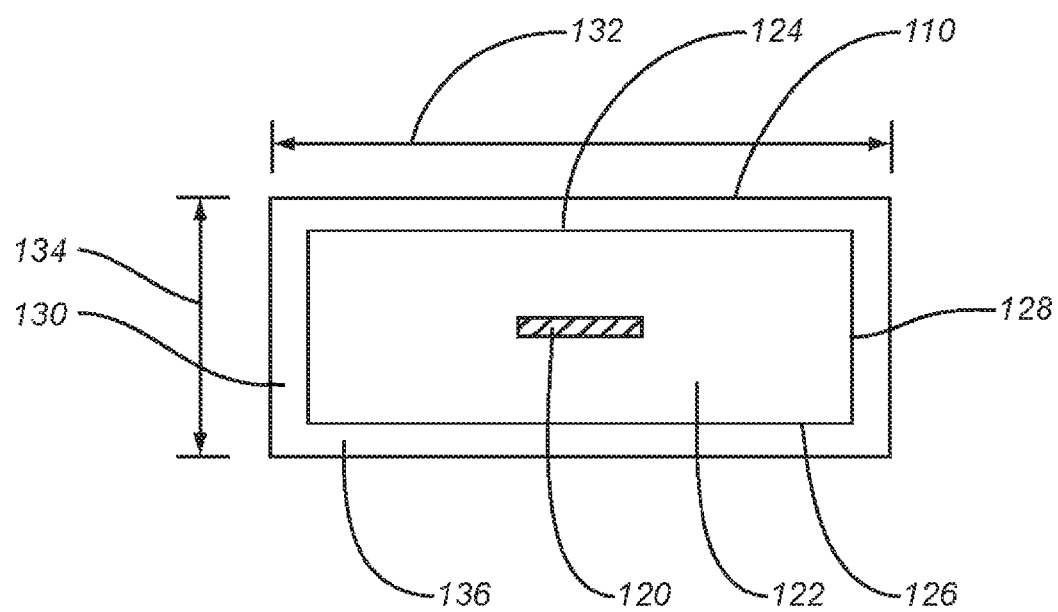
FIG. 7 illustrates cross-section perpendicular to the length of the flexible circuit connector of FIG. 6.

FIG. 7 illustrates a cross section of the FPC section 110 along the length of the FPC section 110. The cross-section includes a central conductor 120, surrounded by non-conductive dielectric 122, a top shield 124 a bottom shield 126 and two side shields 128 and 130. The shielding layers 124, 126, 128, 130 are surrounded by another isolative dielectric layer 136. In one embodiment of such a cross section, the dimensions of the device are approximately 0.50 mm thick 134 and 1.85 mm wide 132.

Figure 8:
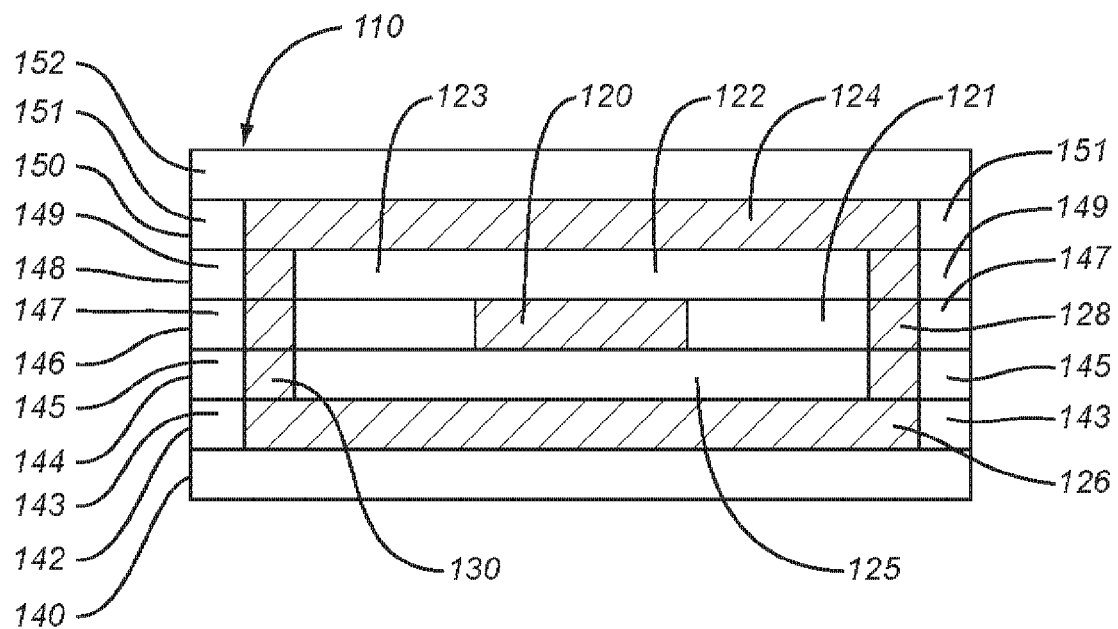
FIG. 8 illustrates an exemplar layer construction of the cross-section of the flexible circuit connector of FIG. 7.

FIG. 8 illustrates the layer construction of the embodiment of the FBC section 110 illustrated in FIG. 7. In this embodiment the FPC is constructed of a three conductive layer FPC. The embodiment illustrated has 7 total layers in alternative embodiments other numbers of layers are possible. The layers are comprised of two different types of materials, conductive materials and dielectric non-conductive materials. In the present embodiment, the conductive material is copper and the dielectric material is Mylar. Other suitable materials for each are available and known in the art. The first layer 140 is a solid dielectric layer. The second layer 142 (first conductive layer) contains the bottom shield 126 base of conductive material flanked by dielectric material 143. The third layer 144 contains a central dielectric material 125 flanked by side shields 128 and 130 which are flanked by dielectric sections 145. The fourth layer 146 (second conductive layer) contains a central dielectric the RF conductor 120 flanked by dielectric sections 121 flanked by the side shields 128 and 130 which are flanked by dielectric sections 147. The fifth layer 148 contains a central dielectric section 123 flanked by the side shields 128 and 130 flanked by dielectric sections 149. The sixth layer 150 (third conductive layer contains the top shield 124 flanked by dielectric sections 151. The seventh layer is a solid dielectric section. The entire stack may be covered with an isolative conformal coating. The processes and thicknesses and materials used for manufacture of suitable Flexible Printed Circuits are known to those skilled the art of the manufacture of FPCs.

Figure 9:
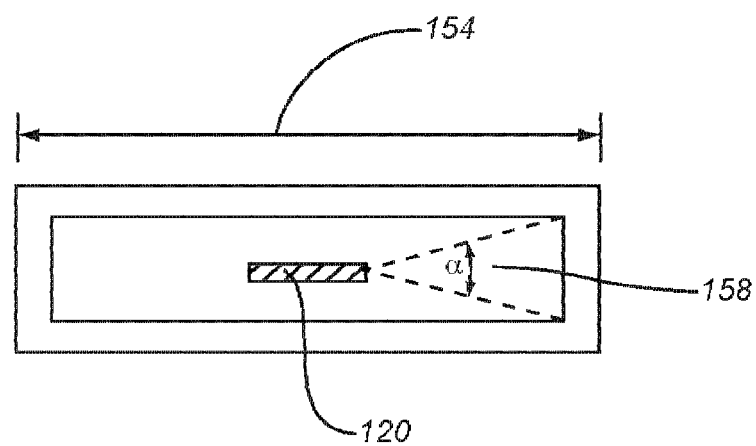
FIG. 9 illustrates alternative geometries for the cross section of the flexible circuit illustrated in FIG. 6.
Figure 9:
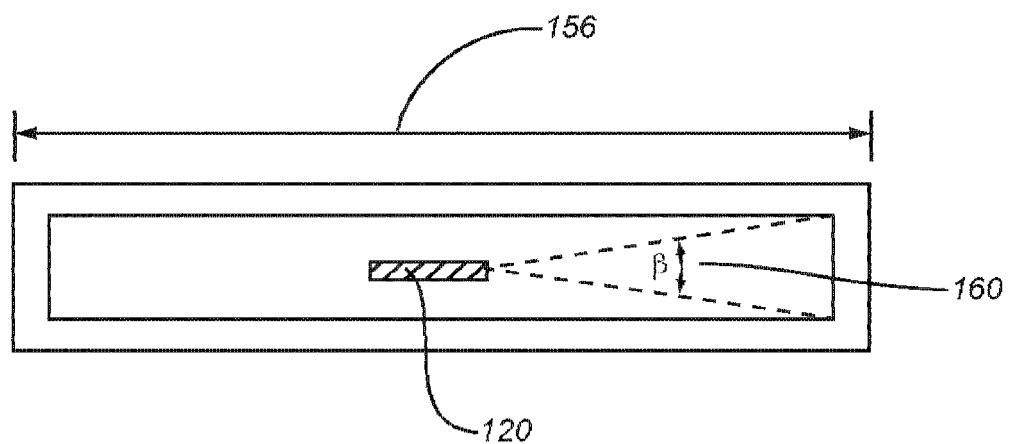

FIG. 9 illustrates two alternative geometries for the construction. These two embodiments differ from each other and the embodiment 110 illustrated in FIG. 7 in that they are of different widths 132, 154 and 156. As the width increases the angle of exposure 158 160 (angle not shown in FIG. 7) of the side shields of the radiation from the central conductor 120 decreases. In each the center conductor 120 is of the same geometry. The top and bottom shields in the embodiment shown are solid. The side shields can be of varying construction as will be illustrated below. The constructions may result in different levels of signal leakage. The wider the width the less this leakage. However the wider the geometry the less routable the FPC cable will be. Therefore the geometry of FIG. 7 maximizes routability while the widest geometry in FIG. 9 minimizes leakage while the median width is a balance between the other two geometries.

Figure 10:
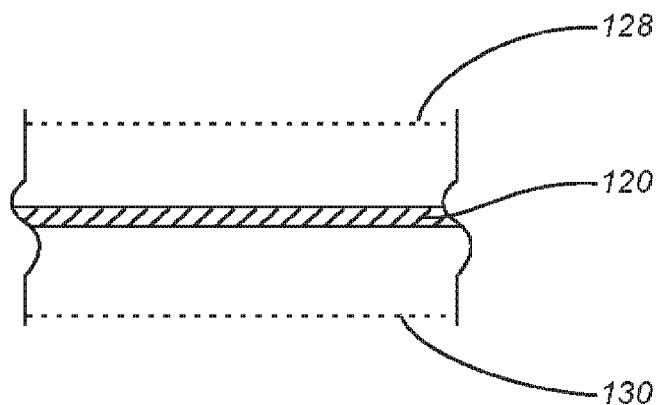
FIG. 10 illustrates an exemplar mask for the RF conductor layer of the flexible circuit connector.

FIG. 10 illustrates a configuration of the side shields 128 and 130. In this embodiment the side shield is constructed of vias or a series of channels that connect the top and bottom shields (not shown) but not to each other. These vias can be of different shapes. In the example shown they are cylindrical, in other configurations they could be square, rectangular oval or any number of other shapes. The shape and spacing of the vias should take into consideration the frequencies of the RF signal to be carried by the conductor 120 in that the spacing should be less than the shortest wavelength to be carried on conductor 120.

Figure 12:
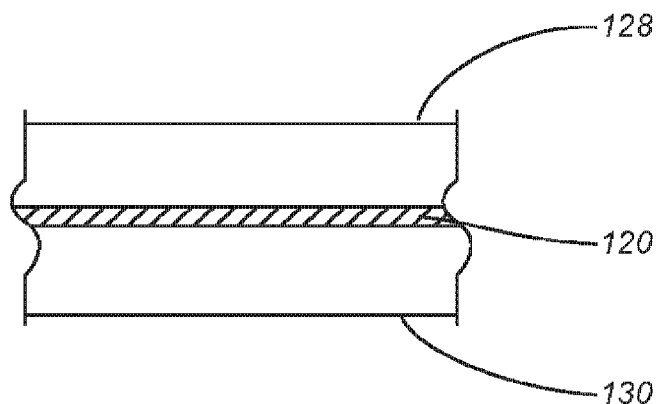
FIG. 12 illustrates yet another alternative exemplar mask showing a different side conductor shield.

FIG. 12 illustrates an alternative embodiment of the side shields. In this embodiment the side shields are constructed of solid sheets of conductive material. The construction is less flexible than the construction illustrated in FIG. 10 but does a better job preventing side leakage.

Figure 11:
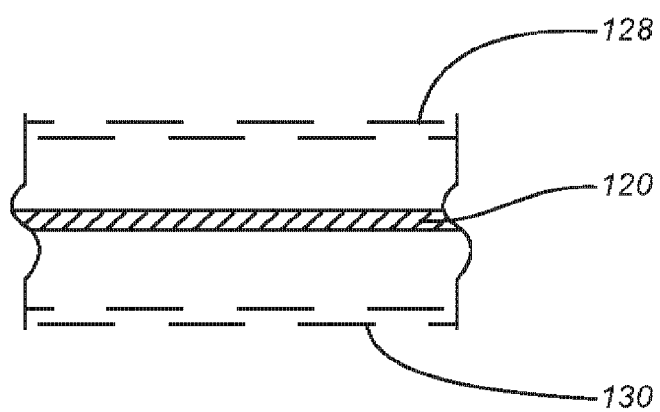
FIG. 11 illustrates an alternative exemplar mask showing a different side conductor shield.

FIG. 11 illustrates yet another alternative embodiment of the side shields. This construction balances between flexibility and minimizing side leakage.

Figure 13:
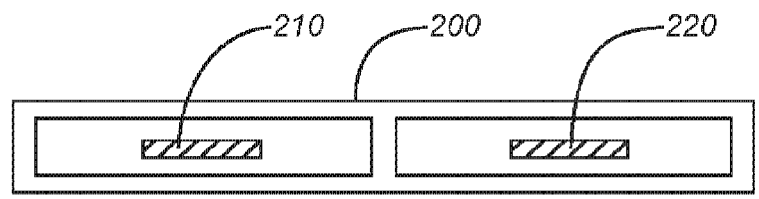
FIG. 13 illustrates a flexible circuit with side by side shielded RF conductors.

FIG. 13 illustrates an embodiment of an FPC RF connector 200. In this embodiment the FPC is constructed to have two side-by-side shielded conductors 210 and 220. The advantage of the side-by-side configuration is that the important height dimension is minimized. However, depending on the construction of the side shields, it may be necessary to bolster the shielding between the two conductors to avoid cross talk between the conductors due to leakage.

Figure 14:
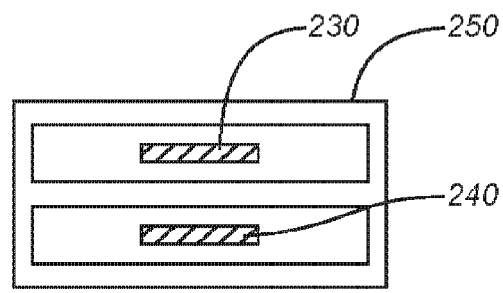
FIG. 14 illustrates a flexible circuit with stacked shielded RF conductors.

FIG. 14 illustrates an alternative two conductor FPC RF connector 250. In this configuration the shielded conductors 230 and 240 are stacked. The advantage is that the side leakage is less of an issue, the disadvantage is nearly twice the height dimension and less flexibility. Other configurations are also possible such as staggered configurations. Either staggered vertically or horizontally or both are all possible.

Figure 15:
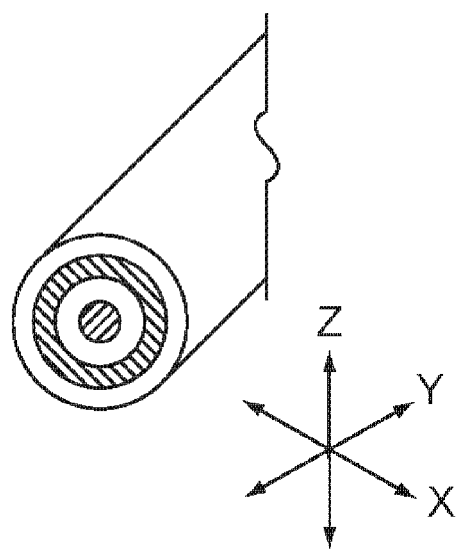
FIG. 15 illustrates signal leak vector characteristics of prior art coaxial micro-wire.
Figure 16:
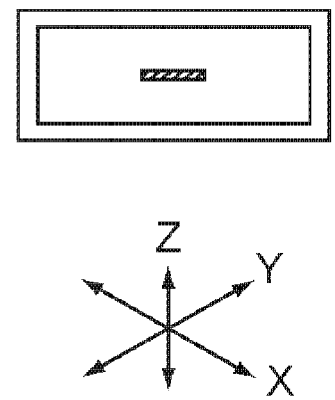
FIG. 16 illustrates signal leak vector characteristics of the flexible circuit board RF connector of FIG. 10.

FIG. 15 and FIG. 16 illustrate the relative leakage profiles of the prior art micro-wire and the current stitched side shield design. The relative leakage in the z-axis in the FPC connector is relatively smaller than the leakage out the sides. In many instances this z-axis leakage is more important to the mobile device than the side leakage.

Figure 17:
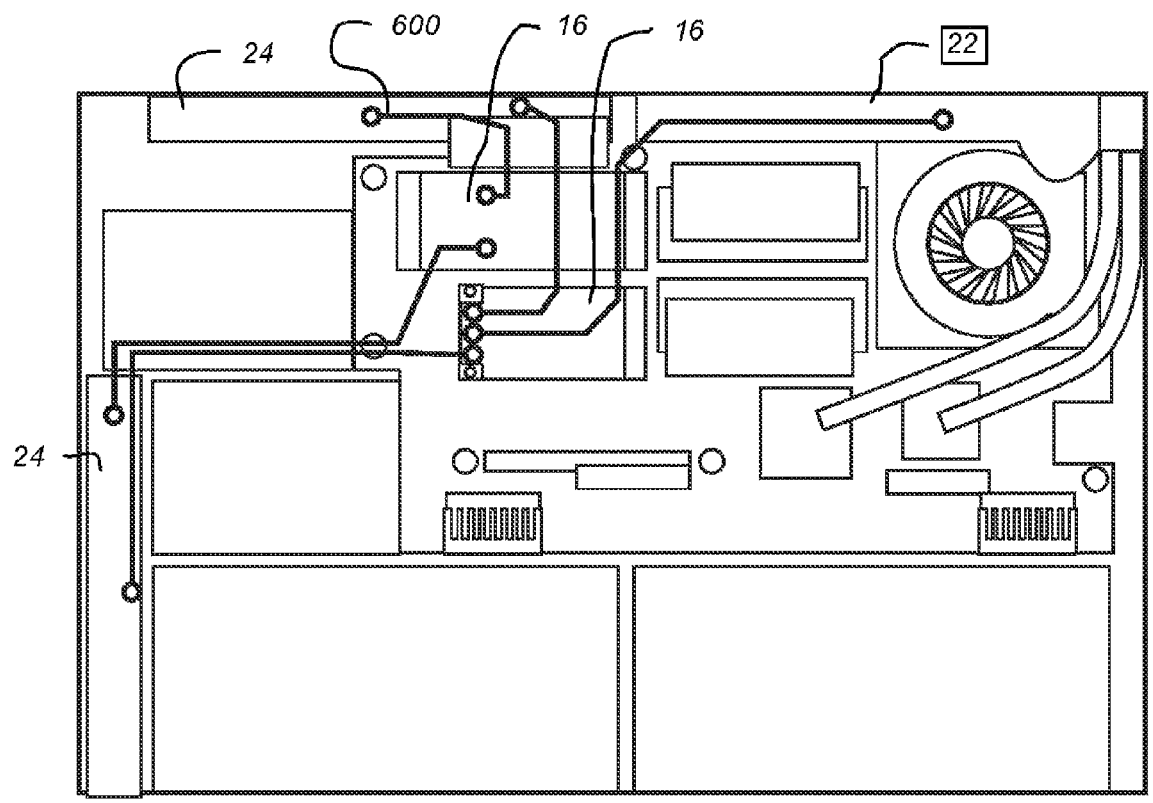
FIG. 17 illustrates an example of wiring paths to connect the components illustrated in FIG. 3.

FIG. 17. Illustrates the RF component connections necessary for the RF related components illustrated in FIG. 3. One such connection path is labeled 600.

Figure 18:
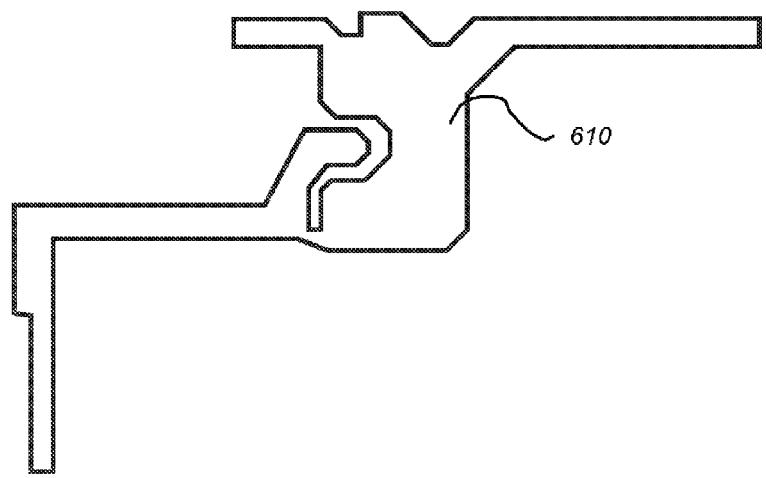
FIG. 18 illustrates a flexible circuit board with multiple shielded RF conductors for connecting all the devices illustrated in FIG. 18.

FIG. 18 illustrates a FPC RF connector cable 610 that is designed to connect all the RF components 16, 22, 24 illustrated in FIG. 17.

Figure 19:
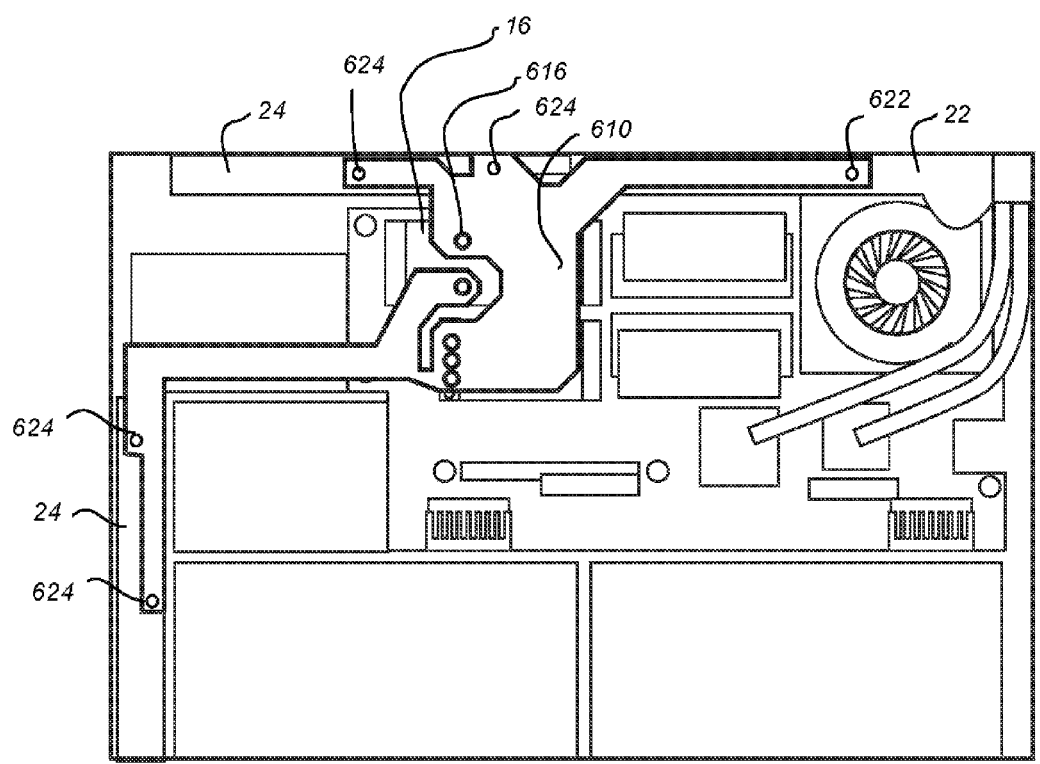
FIG. 19 illustrates the flexible circuit board with multiple shielded RF conductors of FIG. 18 in place connecting the components of the device illustrated in FIG. 3.

FIG. 19 illustrates the FPC RF connector 610 in place connecting all the shown components 16, 22, 24 with a single part with less steps with greater consistency that the prior art use of multiple micro-wires. In this embodiment all of the connections 616, 622, 624 can be made in a single step unlike the prior art process of connecting multiple microwire coaxial cables one end at a time. All of the routing was taken care of in the design of the FPC. All of the routing is self-aligning—align the connectors 616, 622 and 624 in one step and make the connections. All of the RF wiring is now easily located by locating the RF FPC which can easily identified from a manual to the device by looking at the shape of the FPC. All of these advantages result in faster assembly with more consistency and less error during the assembly and or repair or service of the device in which it is employed.

Figure 20:
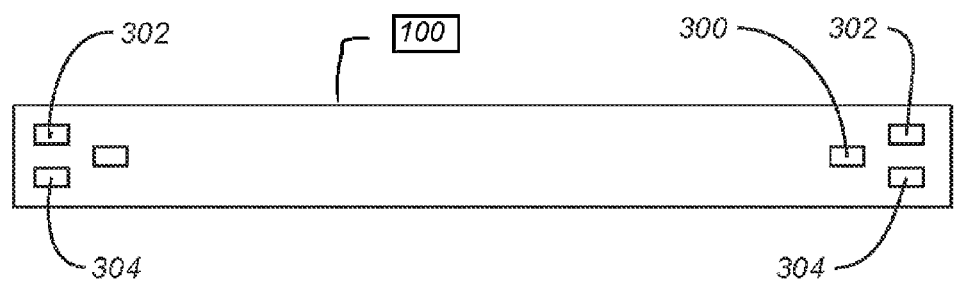
FIG. 20 illustrates. A flexible circuit board with a single shielded RF conductor showing an example of surface mount pads for receiving an RF connector.

FIG. 20 illustrates the mounting pads for mounting surface mount coaxial RF connectors to and embodiment of the FPC RF connector pad 300 connects to the shielded conductor and 302 and 304 connect to the shields for the conductor connected to pad 300.

Figure 21:
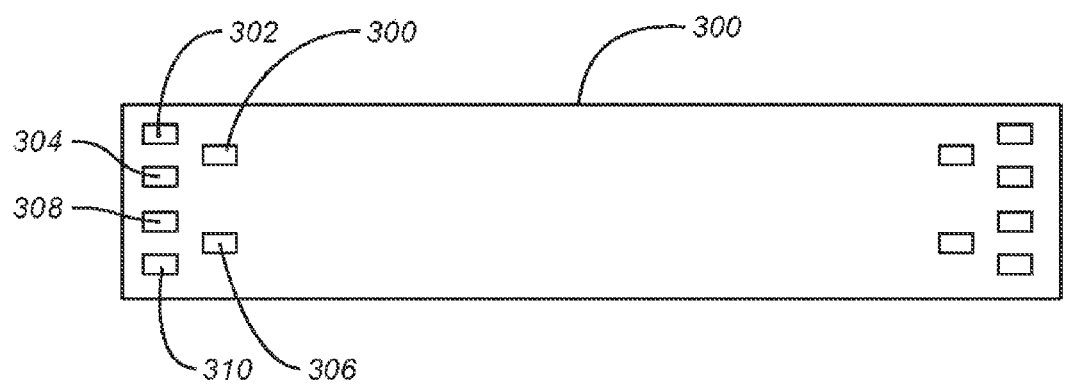
FIG. 21 illustrates surface mounting pads for a flexible circuit board with two side by side shielded conductors.

FIG. 21 illustrates a pad configuration for an FPC RF connector with two side-by-side shielded conductors.

Figure 22:
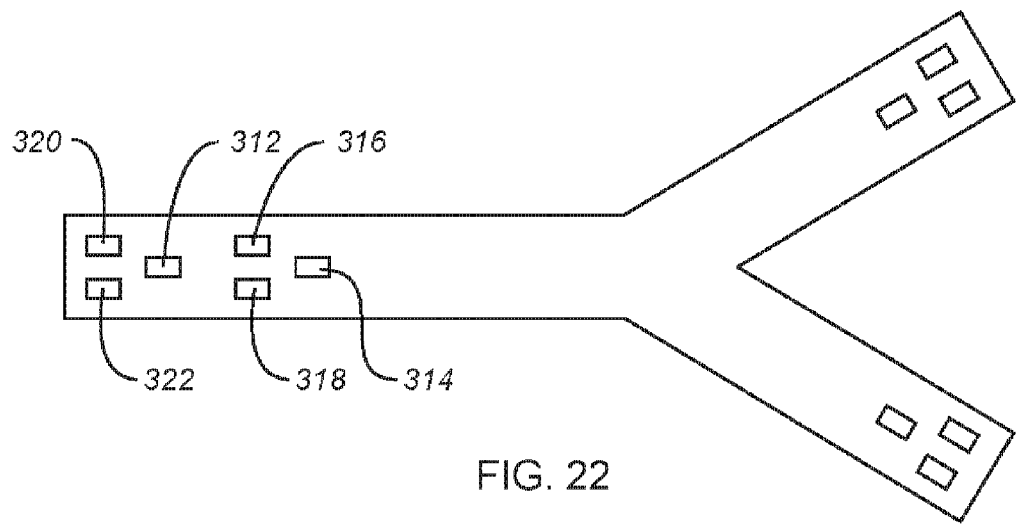
FIG. 22 illustrates surface mount pads for a flexible circuit board with stacked shielded conductors.

FIG. 22 illustrates the pad configuration for a stacked two shielded conductor FPC RF connector which are stacked on the left side and branched on the right side.

Figure 23:
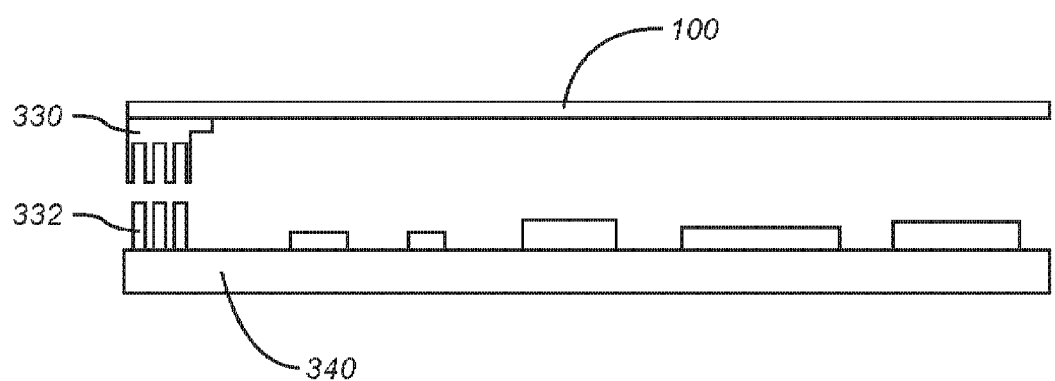
FIG. 23 illustrates a side view of the flexible circuit board with a female RF connector mounting to a male RF connector mounted on a circuit board.

FIG. 23 illustrates a side illustration of a FPC RF connector 100 with a female coaxial RF connector 332 mounted to the FPC mounting pads (not shown) and the male coaxial RF connector is mounted to the circuit board 340.

Figure 24:
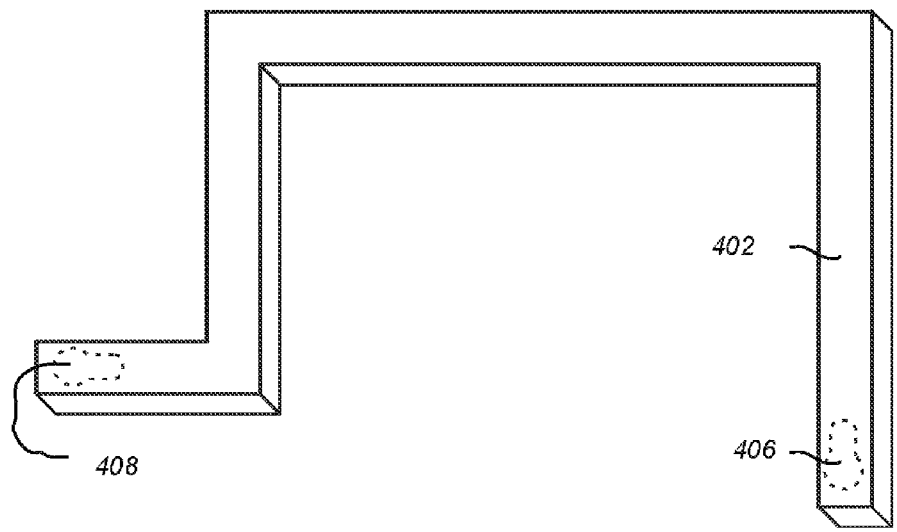
FIG. 24 illustrates a single shielded conductor flexible circuit board RF connector.
Figure 25:
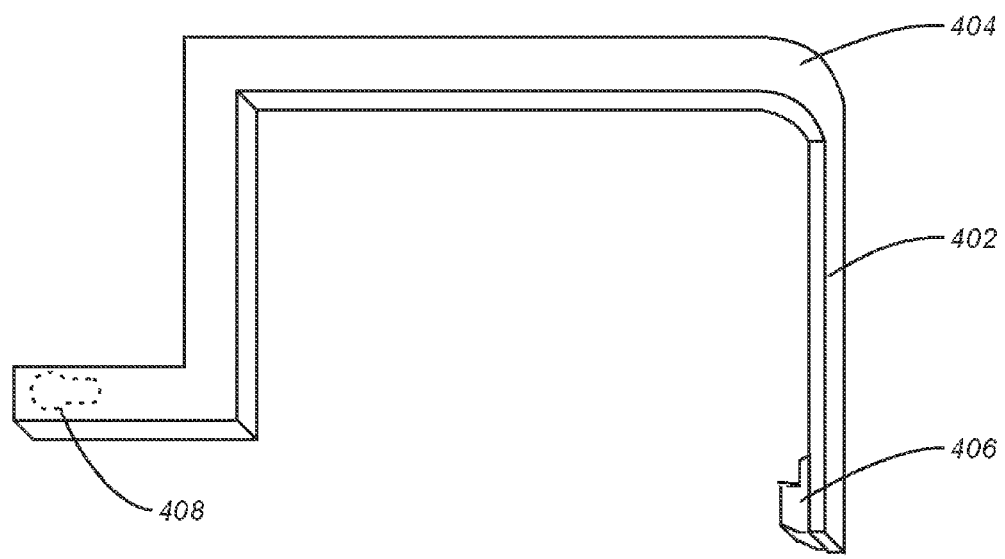
FIG. 25 illustrates the flexible circuit board RF connector of FIG. 24 with for going around a corner.

FIG. 24 and FIG. 25 illustrates an alternative embodiment illustrating the routability of the FPC RF connector 400. In FIG. 24 the x/y routing is hard printed in the shape of the FPC as constructed. In FIG. 25 the right section 402 is bent down in the z-axis to connect the coaxial RF connector 406 in a positioned normal to the plane of the other connector 408.

Figure 26:
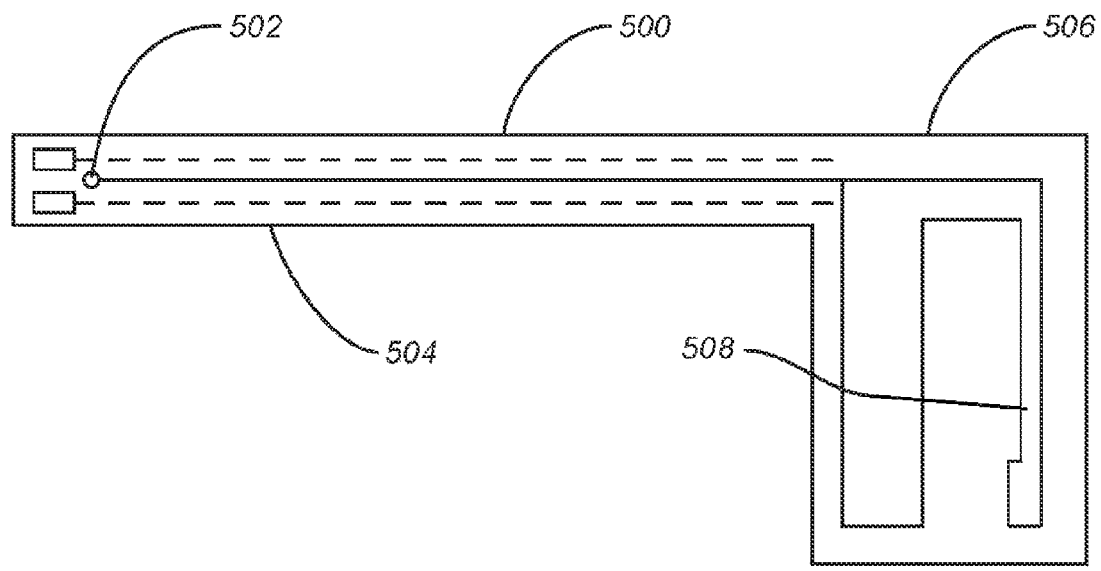
FIG. 26 illustrates a flexible circuit board RF connector with an integrated antenna.

FIG. 26 illustrates another embodiment incorporating an FPC Shielded RF conductor. In this embodiment 500 an antenna is integrated into the FPC design. The FPC 500 has three sections. The first section 502 includes pads for receiving a coaxial RF connector for connecting to an RF circuitry device. The second section 504 includes a shielded RF conductor of the type(s) previously described and a third section 506 where the shielding stops and the conductor is geometrically configures to act as an antenna for the desired frequencies as defined by the RF circuitry's requirements.

Figure 27:
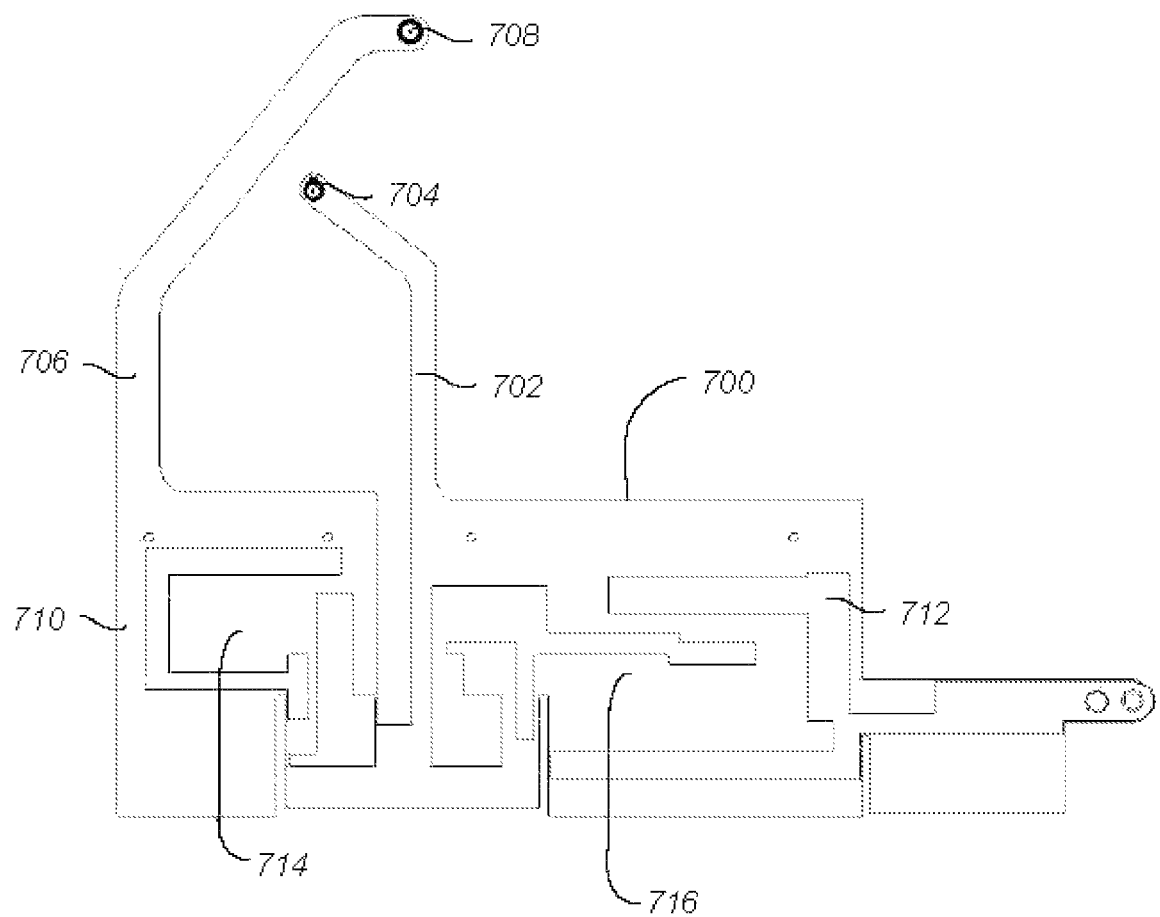
FIG. 27 illustrates a flexible circuit board RF connector with two inputs and two integrated antennas.

FIG. 27 illustrates a flexible circuit board RF connector with two inputs 704 and 708 and two integrated antenna sections 710 and 712. Each antenna section 710 and 712 contains antenna shaped traces 714 and 716 respectively. The circuit includes shielded signal conductors (not shown) as previously described that electrically connect the inputs 710 and 712 to the antenna sections 714 and 716 respectively. The shielding (not shown stops when the antenna sections are reached as previously described in FIG. 26.

Figure 28:
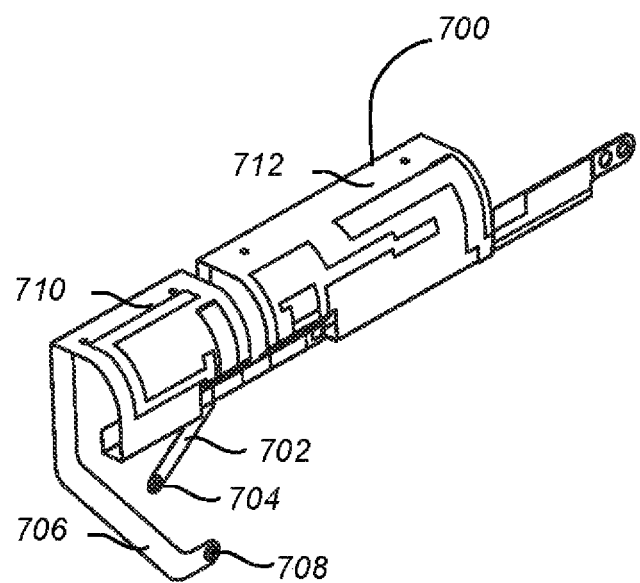
FIG. 28 illustrates the flexible circuit board RF connector of FIG. 27 as shaped when in place around the edge of a tablet PC.

FIG. 28 illustrates the flexible circuit board RF connector of FIG. 27 as shaped when in place around the edge of a tablet PC.

Figure 29:
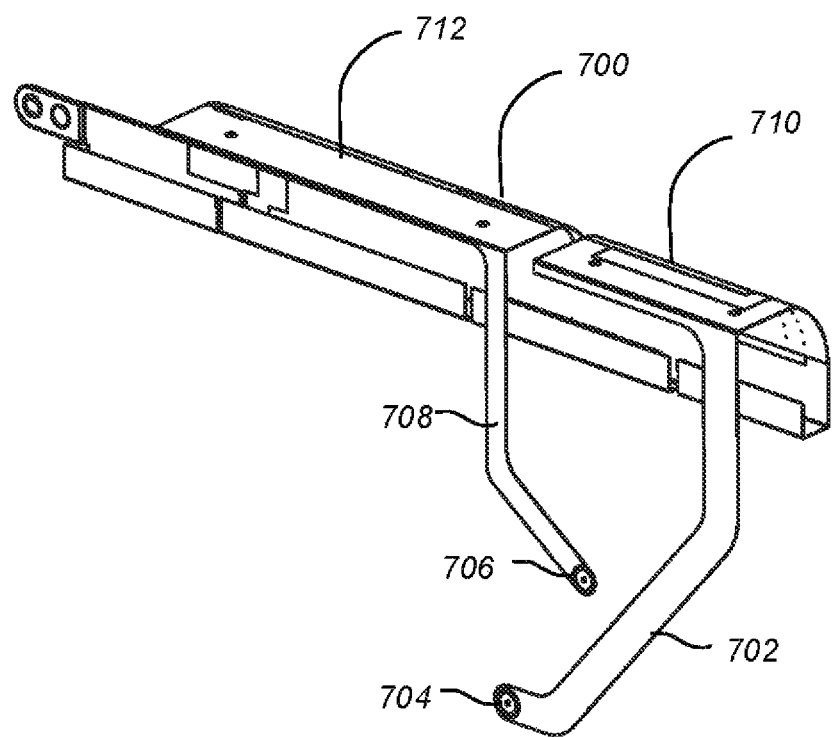
FIG. 29 illustrates another view of the flexible circuit board RF connector of FIG. 28.

FIG. 29 illustrates another view of the flexible circuit board RF connector of FIG. 28.

In comparison to Micro-wire coaxial cabling the present FPC of the current design has the following advantages:

a) FPC can be pinched or sandwiched with less or no effect on VSWR (less signal reflection, waste, detuning cable);
b) Dielectric and typical FPC (Kapton) material are more resilient and less compressive;
c) Can provide high wire shielding performance with is necessary to be accepted as a data device on a cellular network such as Sprint, Verizon, and T-Mobile;
d) Solid annealed copper with thickness of ½ ounce (0.65 mils) or 1 ounce (1.3 mils) provides >99% E field shielding effectiveness ($SE_E$>60 dB) and 75-85% H field shielding effectiveness ($SE_H$>15 dB)
e) Only 0.5 mm (20 Mills thick with less tenuous routing.
f) Single piece containing all wires in inserted in single step
g) Single piece can be mounted like a 'placemat' in which all wires fall into pre-located channels with no individual insertion steps
h) Self-aligning FPC-1 piece harness uses uneven system internal parts as an advantage, locating the FPC piece quickly.
i) Less prone to assembly errors or system part variances that can affect antenna.
j) Uses 'locator pins' or 'placemat channels the not only do not crush the FPC, but are usually not even near the signal traces, meaning the mounts have zero effect on the wires' performance
k) FPC Minimum Bend Radius for 3 layers is ~4 to 5 mm (~200 mils) allowing for tighter 'right angle' bends in the design saving internal x, y, and z space
l) The service loop (SL) on the universal wiring FPC RF connection arms is
m) SL just long enough to assemble without fumbling or tugging.
n) SL does not move into unwanted EMI areas by self-locating features.
o) SL does not move into antenna resonance area(s) keeping more consistent product output to customers.
p) Truly field and customer upgradeable RF antennas. In one embodiment, the end bezels snap off too reveal RF antennas, which can be replaced, or even upgraded to new type or technology in the field.
q) Ex: WLAN/WiMax 2.5 GHz, upgraded to WLAN/Wimax ultra—in the field by customer, in only a few seconds!
r) Swappable antennas as shown in this disclosure allow faster test permutations to cover multiple antennas and radio technologies using the very same test platform. Result:
  (1) decreased time to market for large radio permutations.
  (2) Greatly decreased time to market for incremental radio additions.

While the invention has been described with respect to a limited number of embodiments, those skilled in the art, having benefit of this invention, will appreciate that other embodiments may be devised which do not depart from the scope of the invention as disclosed herein. Accordingly, the scope of the invention should be limited only by the attached claims.

APPENDIX

Glossary

Attenuation (Measured in decibels "dB")—The amount of signal loss for which the connector is responsible. Other similar words are Loss and Attenuate. A term typically used in reference to long transmission lines like cables.

Blade Contact—A flat metal contact typically used in multiple contact connectors Electromagnetic Interference—Electromagnetic interference (EMI) is any electromagnetic disturbance that degrades or limits the performance of the considered electronic system. It can be induced by the system being considered or its environment. The amount of interference electronic equipment can emit is regulated. Internally, some systems may require other levels of EMI be met, like radio receiver sensitivity.

Flexible Printed Circuitry—This is similar to a PCB, but is flexible and uses Kapton® (or more commonly referred to as polyimide) instead of rigid FR4 in most cases. This sometimes is referred to as FPC or Flex.

Insertion Loss (measured in decibels "dB")—The amount of signal loss for which the connector is responsible and is mostly seen in cable applications.

Reflection—A process that occurs when a propagating electromagnetic wave impinges upon a change in its supporting media properties. In the case of an abrupt change the incident wave will "bounce" off of the barrier in the opposite direction it came from. In other cases, some of the wave reflects while the rest continues onward.

Return Loss—the amount of signal reflected back

Shielding—The protective enclosure surrounding a transmission medium, designed to minimize electromagnetic interference (EMI/RFI).

Current RF micro-wire Coax Construction (1.38 mm micro-wire Coax Dimensions per Layer)

| MECHANICAL: | |
|---|---|
| Conductor: | Diameter 0.31 mm, #30AWG, 7/1.02, Silver plated annealed copper wire. |
| Dielectric: | Diameter: 0.89 mm, FEP (soft Core easily damaged or pinched) |

-continued

| MECHANICAL: | |
|---|---|
| Outer conductor: | Diameter: 1.15 mm, Tinned annealed copper wire (lossy wireweave) |
| Jacket: Diameter: | 1.38 mm, FEP, Color: Black or Gray (soft jacket easily damaged) |

What is claimed is:

1. An mobile electronic device with a wireless transmitter and/or receiver comprising:
   a. RF circuit board with circuitry for generating and/or receiving an RF signal;
   b. an antenna for transmitting and/or receiving an RF signal; and
   c. a multilayer flexible circuit board cable with a conductor trace for carrying the signal between the RF circuit board circuitry and the antenna, and the conductive trace is sandwiched between a plurality of shielding trace layers conductively connected by a series of narrowly spaced channels which overlap without contacting each other.

2. The electronic device of claim 1 where the shielding trace layers are significantly wider than the conductive trace layer.

3. The electronic device of claim 1 where the multilayer flexible circuit board with a conductor trace is connected to the RF circuit board with a UFL connector.

4. An mobile electronic device with a wireless transmitter and/or receiver comprising:
   a. RF circuit board with circuitry for generating and/or receiving an RF signal;
   b. a multilayer flexible circuit board with (1) an unshielded antenna trace section conductively connected to (2) conductive trace cable section with a plurality of shielding trace layers conductively connected by a series of narrowly spaced, overlapping without contacting, channels for conductively connecting the antenna section to the RF circuit board.

5. The electronic device of claim 4 where the shielding trace layers are significantly wider than the conductive trace layer.

6. The electronic device of claim 4 where the shielded conductor trace section is connected to the RF circuit board with a UFL connector.

7. An electronic device with a wireless transmitter and/or receiver comprising:
   a. RF circuit board with circuitry for generating and/or receiving an RF signal;
   b. an antenna for transmitting and/or receiving an RF signal; and
   c. a multilayer flexible circuit board cable with a conductor for carrying the signal between the RF circuit board circuitry and the antenna, and the conductor is sandwiched between a plurality of shielding trace layers conductively connected by a series of narrowly spaced, overlap without contacting, channels.

8. The electronic device of claim 7 where the shielding trace layers are significantly wider than the conductive trace layer.

9. The electronic device of claim 7 where the multilayer flexible circuit board with a conductor is connected to the RF circuit board with a UFL connector.

* * * * *